US011289414B2

(12) United States Patent
Goh et al.

(10) Patent No.: US 11,289,414 B2
(45) Date of Patent: Mar. 29, 2022

(54) SYSTEMS, METHODS, AND APPARATUSES FOR IMPLEMENTING A PAD ON SOLDER MASK (POSM) SEMICONDUCTOR SUBSTRATE PACKAGE

(71) Applicant: Intel Corporation, Santa Clara, CA (US)

(72) Inventors: Eng Huat Goh, Ayer Itam (MY); Jiun Hann Sir, Gelugor (MY); Min Suet Lim, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 7 days.

(21) Appl. No.: 16/098,407

(22) PCT Filed: May 16, 2017

(86) PCT No.: PCT/US2017/032938
§ 371 (c)(1),
(2) Date: Nov. 1, 2018

(87) PCT Pub. No.: WO2018/004850
PCT Pub. Date: Jan. 4, 2018

(65) Prior Publication Data
US 2019/0122974 A1 Apr. 25, 2019

(30) Foreign Application Priority Data
Jul. 1, 2016 (MY) ............................ PI 2016702455

(51) Int. Cl.
*H01L 23/498* (2006.01)
*H01L 23/31* (2006.01)
(Continued)

(52) U.S. Cl.
CPC ........ *H01L 23/49838* (2013.01); *H01L 23/31* (2013.01); *H01L 23/49866* (2013.01);
(Continued)

(58) Field of Classification Search
CPC ... H01L 23/49838; H01L 23/31; H01L 23/50;
H01L 23/49866; H01L 23/49816;
(Continued)

(56) References Cited

U.S. PATENT DOCUMENTS 5,641,946 A * 6/1997 Shim ................... H01L 21/4853
174/261
6,443,351 B1 * 9/2002 Huang ................. B23K 3/0623
228/103
(Continued)

FOREIGN PATENT DOCUMENTS

| JP | 2002-203925 | 7/2002 |
| JP | 2008-277677 | 11/2008 |

OTHER PUBLICATIONS

International Search Report and Written Opinion for International Patent Application No. PCT/US2017/032938 dated Aug. 23, 2017, 14 pgs.
(Continued)

*Primary Examiner* — Thao X Le
*Assistant Examiner* — Gardner W. S. Swan
(74) *Attorney, Agent, or Firm* — Schwabe, Williamson & Wyatt, P.C.

(57) ABSTRACT

In accordance with disclosed embodiments, there are provided systems, methods, and apparatuses for implementing a Pad on Solder Mask (PoSM) semiconductor substrate package. For instance, in accordance with one embodiment, there is a substrate package having embodied therein a functional silicon die at a top layer of the substrate package; a solder resist layer beneath the functional silicon die of the substrate package; a plurality of die bumps at a bottom surface of the functional silicon die, the plurality of die bumps electrically interfacing the functional silicon die to a substrate through a plurality of solder balls at a top surface of the solder resist layer; each of the plurality of die bumps
(Continued)

electrically interfaced to a nickel pad at least partially within the solder resist layer and beneath the solder balls; each of the plurality of die bumps electrically interfaced through the nickel pads to a conductive pad exposed at a bottom surface of the solder resist layer; and in which each of the conductive pads exposed at the bottom surface of the solder resist layer are electrically interfaced to an electrical trace at the substrate of the substrate package. Other related embodiments are disclosed.

16 Claims, 11 Drawing Sheets

(51) Int. Cl.
    *H01L 23/50*     (2006.01)
    *H01L 23/00*     (2006.01)
    *H01L 21/48*     (2006.01)

(52) U.S. Cl.
    CPC .......... *H01L 23/50* (2013.01); *H01L 21/4853* (2013.01); *H01L 23/49816* (2013.01); *H01L 24/16* (2013.01); *H01L 24/81* (2013.01); *H01L 2224/131* (2013.01); *H01L 2224/16237* (2013.01); *H01L 2224/16238* (2013.01); *H01L 2224/81193* (2013.01); *H01L 2224/81447* (2013.01); *H01L 2224/81455* (2013.01)

(58) Field of Classification Search
    CPC ..... H01L 24/81; H01L 24/16; H01L 21/4853; H01L 2224/81447; H01L 2224/131; H01L 2224/81193; H01L 2224/16237; H01L 2224/81455; H01L 2224/16238
    USPC ....................................................... 257/738
    See application file for complete search history.

(56) References Cited

U.S. PATENT DOCUMENTS

| | | | |
|---|---|---|---|
| 6,548,898 B2 | 4/2003 | Matsuki et al. | |
| 6,780,023 B2* | 8/2004 | Miyagawa | H05K 1/112 439/68 |
| 7,714,452 B2* | 5/2010 | Clevenger | H01L 23/13 257/738 |
| 7,863,741 B2 | 1/2011 | Ozaki et al. | |
| 2010/0052080 A1* | 3/2010 | Garcia Tello | H01L 23/53238 257/414 |
| 2010/0052148 A1* | 3/2010 | Hsu | H05K 3/3436 257/692 |
| 2012/0083114 A1 | 4/2012 | Perfecto et al. | |
| 2012/0175772 A1 | 7/2012 | Leung et al. | |
| 2013/0249076 A1* | 9/2013 | Lee | H01L 23/498 257/737 |
| 2014/0045326 A1 | 2/2014 | Liang et al. | |
| 2015/0262840 A1* | 9/2015 | Hsu | H05K 1/181 216/18 |
| 2016/0027752 A1* | 1/2016 | Chuang | H01L 24/13 257/738 |

OTHER PUBLICATIONS

International Preliminary Report on Patentability for International Patent Application No. PCT/US2017/032938, dated Jan. 10, 2019, 11 pages.
Office Action from Malaysian Patent Application No. PI2016702455, dated May 26, 2017, 2 pages.
Office Action and Search Report from Malaysian Patent Application No. PI2016702455 dated Jul. 24, 2019, 4 pages.
Office Action from Malaysian Patent Application No. PI2016702455 dated Mar. 2, 2021, 4 pages.

* cited by examiner

100 Bump System

100 Bump System

Six Layer Design 102

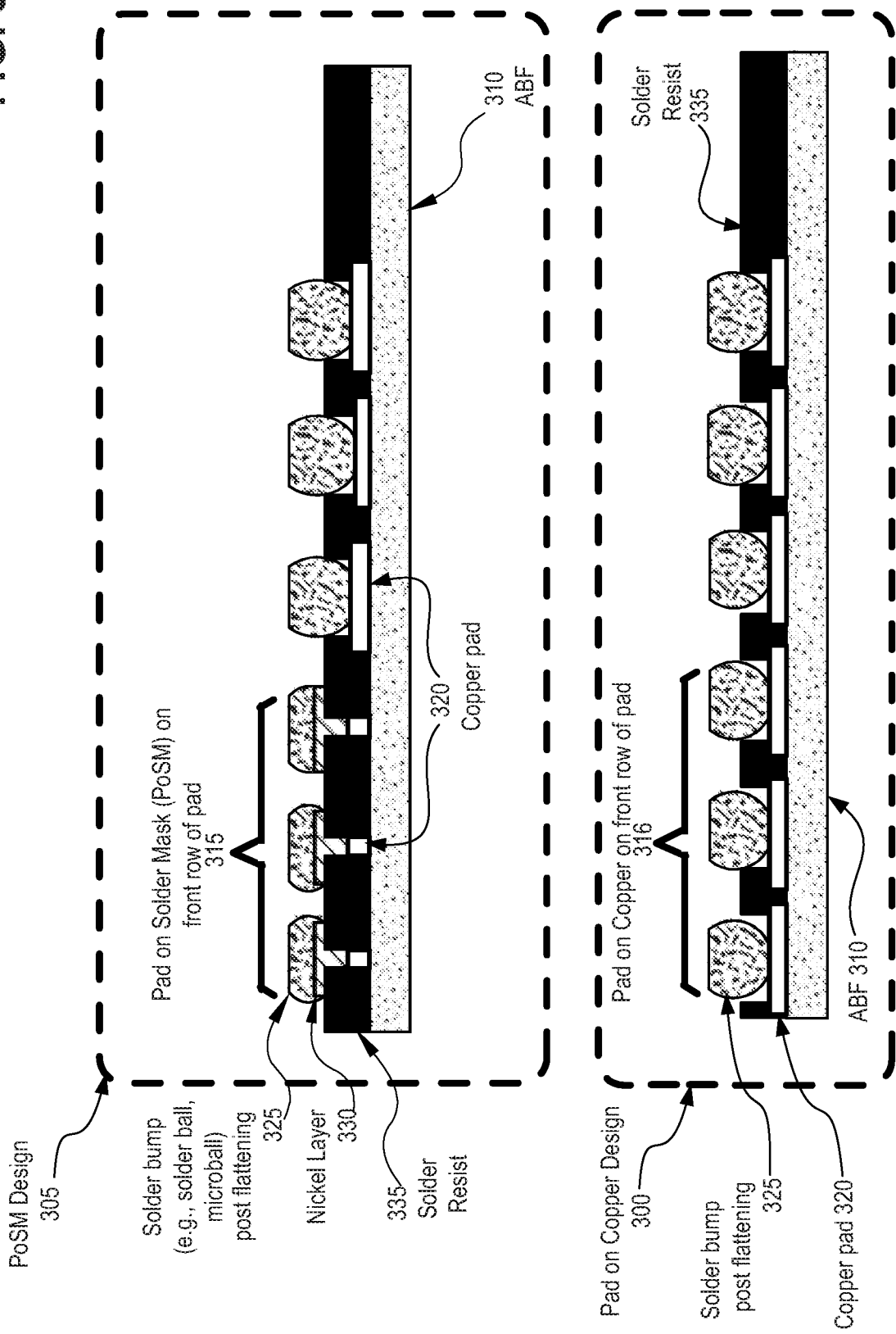

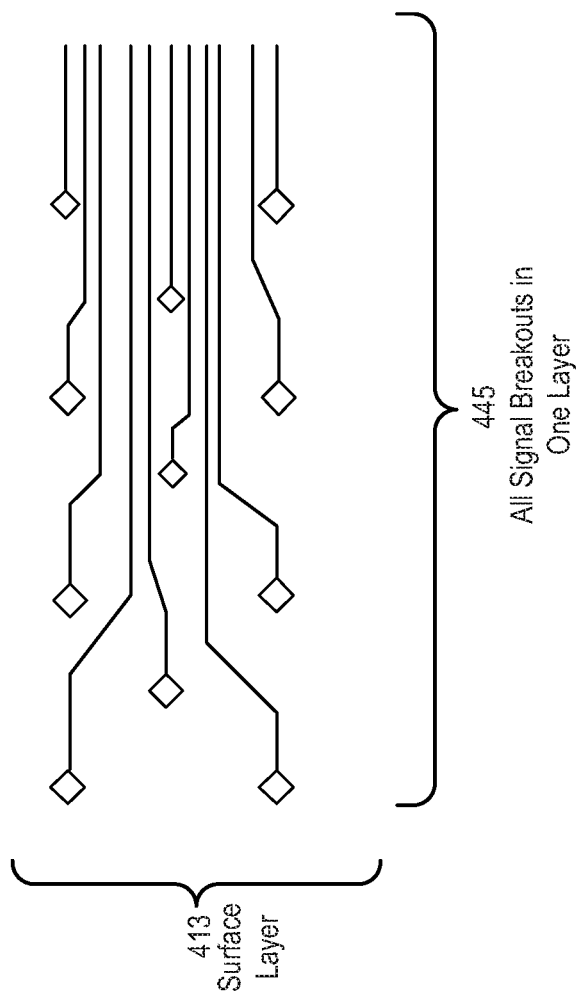

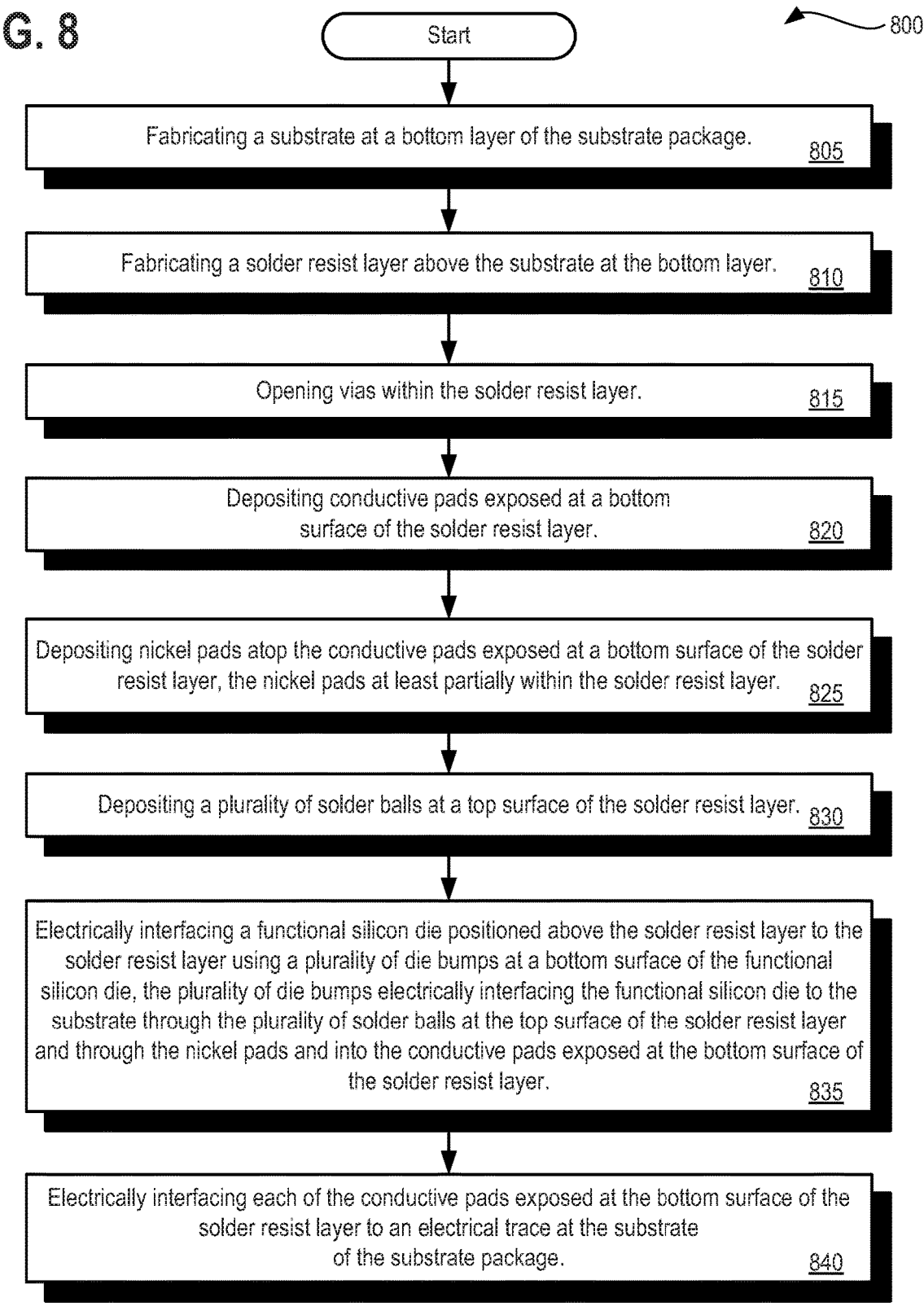

SYSTEMS, METHODS, AND APPARATUSES FOR IMPLEMENTING A PAD ON SOLDER MASK (POSM) SEMICONDUCTOR SUBSTRATE PACKAGE

CROSS-REFERENCE TO RELATED APPLICATION

This patent application is a U.S. National Phase Application under 35 U.S.C. § 371 of International Application No. PCT/US2017/032938, filed May 16, 2017, entitled "SYSTEMS, METHODS, AND APPARATUSES FOR IMPLEMENTING A PAD ON SOLDER MASK (POSM) SEMICONDUCTOR SUBSTRATE PACKAGE," which designates the United States of America, which claims priority to Malaysia Patent Application No. PI2016702455, filed Jul. 1, 2016, of which are hereby incorporated by reference in their entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for implementing a Pad on Solder Mask (PoSM) semiconductor substrate package.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of Modern consumer electronics market frequently demands complex functions requiring very intricate circuitry. Scaling to smaller and smaller fundamental building blocks, (e.g. transistors), has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support increased circuit density.

Conventional package semiconductor package designs heavily rely upon the bump systems on a silicon package especially in terms of the attainable package density and therefore the design performance of such semiconductor packages. Stated more simplistically, the more room occupied by the various elements which make up a semiconductor package, the less "stuff" fits within a given physical space. Also, the larger the elements are within the semiconductor package the farther apart they must be and therefore, information flowing between them takes fractionally longer to travel, resulting in poorer performance.

Conversely, by making the same elements increasingly smaller and thus more densely packed within any given semiconductor package, the better the performance as there can be more "stuff" within the same physical space capable of performing functional aspects of the functional semiconductor silicon dies and devices of the semiconductor package and the shorter the information must travel, thus resulting in faster processing.

On the scale of nanometer semiconductor design, even the very smallest of improvements in size and space reductions translate into incremental performance improvement over time which over the medium to long term, result in massive increases in computing performance, capacity, and capabilities.

Reducing the space occupied by the bump system of a semiconductor device or its package transaction into such physical space reductions.

The present state of the art may therefore benefit from the systems, methods, and apparatuses for implementing a Pad on Solder Mask (PoSM) semiconductor substrate package as is described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 3 depicts another exemplary Pad on Solder Mask (PoSM) design in comparison to a pad on copper design in accordance with described embodiments;

FIG. 4B depicts another Pad on Solder Mask (PoSM) pad design 405 for the signal breakouts at a surface layer in accordance with described embodiments;

FIG. 8 is a flow diagram illustrating a method for implementing a Pad on Solder Mask (PoSM) semiconductor substrate package in accordance with described embodiments.

DETAILED DESCRIPTION

Figure 1A:
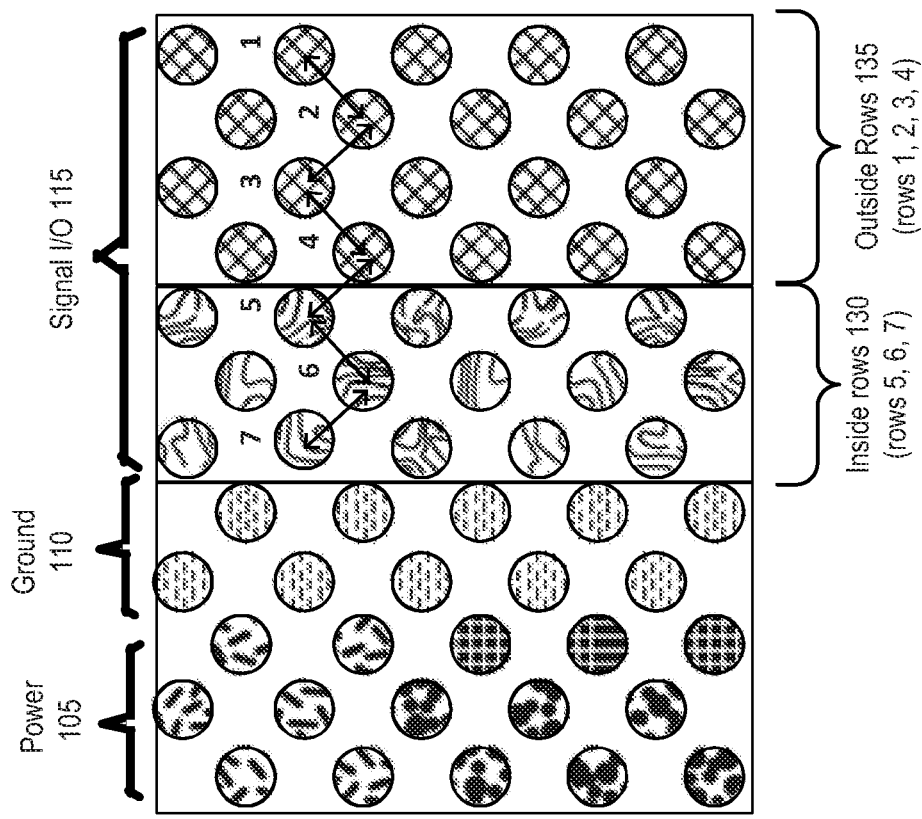
FIG. 1A depicts an exemplary bump system in accordance with described embodiments.

Described herein are systems, methods, and apparatuses for implementing a Pad on Solder Mask (PoSM) semiconductor substrate package in accordance with described embodiments. For instance, in accordance with one embodiment, there is a substrate package having embodied therein a functional silicon die at a top layer of the substrate package; a solder resist layer beneath the functional silicon die of the substrate package; a plurality of die bumps at a bottom surface of the functional silicon die, the plurality of die bumps electrically interfacing the functional silicon die to a substrate through a plurality of solder balls at a top surface of the solder resist layer; each of the plurality of die bumps electrically interfaced to a nickel pad at least partially within the solder resist layer and beneath the solder balls; each of the plurality of die bumps electrically interfaced through the nickel pads to a conductive pad exposed at a bottom surface of the solder resist layer; and in which each of the conductive pads exposed at the bottom surface of the solder resist layer are electrically interfaced to an electrical trace at the substrate of the substrate package.

Low cost semiconductor System On a Chip (SOC) packages are made more cost so as to maintain a competitive advantage through the practice of the described methodologies as set forth herein. Current design SOC package designs call for six layer (6 L) designs to accommodate the signal breakout and escape from the silicon bump pattern due to a need for a sub-layer through which electrical traces are routed away from the bump system of the semiconductor package.

The methodologies as set forth herein permit the same electrical connectivity including all signal breakouts from a four layer (4 L) substrate package thus eliminating two layers and simplifying process and reducing cost.

The silicon bump pattern is a key factor in establishing the eventual layer count of any given substrate design package. For a Central Processing Unit (CPU), Platform Controller Hub (PCH), and System On a Chip (SOC) type design the silicon IO bump pattern and pitch is conventionally designed to utilize two breakout layers resulting in a minimum of a 6 L substrate package for FCBGA (Flip Chip Ball Grid Array) and Core substrates. This is because the core layer 1*fco/bco* does not support breakout design rules with sufficient physical space between the contact pads permitting the requisite number of electrical traces to surface escape the bump field. Additionally, so called FCB GA/Core package substrates utilize an even number layer count, and thus, for each of the two breakout layers (3*f* and 2*f*) on the top there are two buildup layers (3*b* and 2*b*) on the bottom.

Described herein are therefore means by which First Level Interconnect (FLI) pads may be selectively created on the top of the Solder Resist layer to increase the per layer breakout density thus allowing signals breakout to be accomplished entirely with surface escape at a single top layer. All of the FLI pads, or only a subset of them, especially those at the outside rows, may be reduced in size so as to permit sufficient room for the electrical traces to surface escape depending on design requirements.

According to a particular embodiment, First Level Interconnect (FLI) pads on a substrate are selectively modified in accordance with the teachings here at the first several rows (such as rows 1, 2, 3, 4) so as to permit back row IO bumps to surface escape by trace routing at a surface layer between the reduced size pads established by the PoSM design described herein.

Alternative approaches which have been utilized in the conventional arts to enable a 4 L package involve modifying the bump pitch/pattern on the silicon so as to enable a single surface layer breakout. Unfortunately, such an approach drastically increases the overall size of the die and thus translates to a corresponding increase in cost and a reduction in performance.

Bond On Line (BOL) methodologies are also being investigated, however, the openings required for BOL are sufficiently large that they nevertheless restrict the signal breakout density, thus requiring either a larger silicon die to accommodate the space requirements or require sub-layer trace routing.

BOL techniques also are observed to result in early fatigue failure due to the reserve U shape geometry. Flux entrapment on BOL openings also result in UF delam and unacceptable solder migration.

The described techniques result in a 4 L semiconductor package design which is thinner, lest costly, and potentially exhibits greater performance.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1A depicts an exemplary bump system 100 in accordance with described embodiments.

Wafer bumping may be utilized in place of wire bonding as the interconnection path between components of a semiconductor package. The resulting bump system 100 may be fabricated via application of solder at the wafer level forming the "bumps" or balls in contact with the package substrate. Design of the bump system 100 has a direct and immediate effect on the manufacturability, reliability, and potentially cost savings from wafer fabrication through component assembly.

Improved bump systems such as those described herein further provide for a much greater semiconductor package density and improved trace routing, potentially negating the need for one or more conventionally provided semiconductor layers due to the ability to surface route a greater number of connections through the bump system 100 over what is possible with conventional techniques.

Still greater performance improvement, density, cost savings, reliability and manufacturability may be realized over the use of conventional "flip chip" systems for which solder bumps are placed on an active side of a functional silicon device, such as directly on I/O pads or routed from such I/O pads. Flip chip implementations often require additional underfill to increase the reliability of the structure. Potentially eliminating such underfill requirements, eliminating substrate layers for trace routing, and maintaining or improving reliability and manufacturability may all be realized through the application of the techniques as described herein for implementing a Pad on Solder Mask (PoSM).

Within the bump system 100 depicted there is specifically shown a series of power 105 bumps, a series of ground 100 bumps, and many signal I/O 115 bumps to connect with information carrying traces providing electrical interconnects between functional silicon dies and devices of the semiconductor package.

The first several rows from the left side are numbered, with rows 1, 2, 3, and 4 identified as the outside rows 135 and rows 5, 6, and 7 identified as inside rows 130.

Figure 1B:
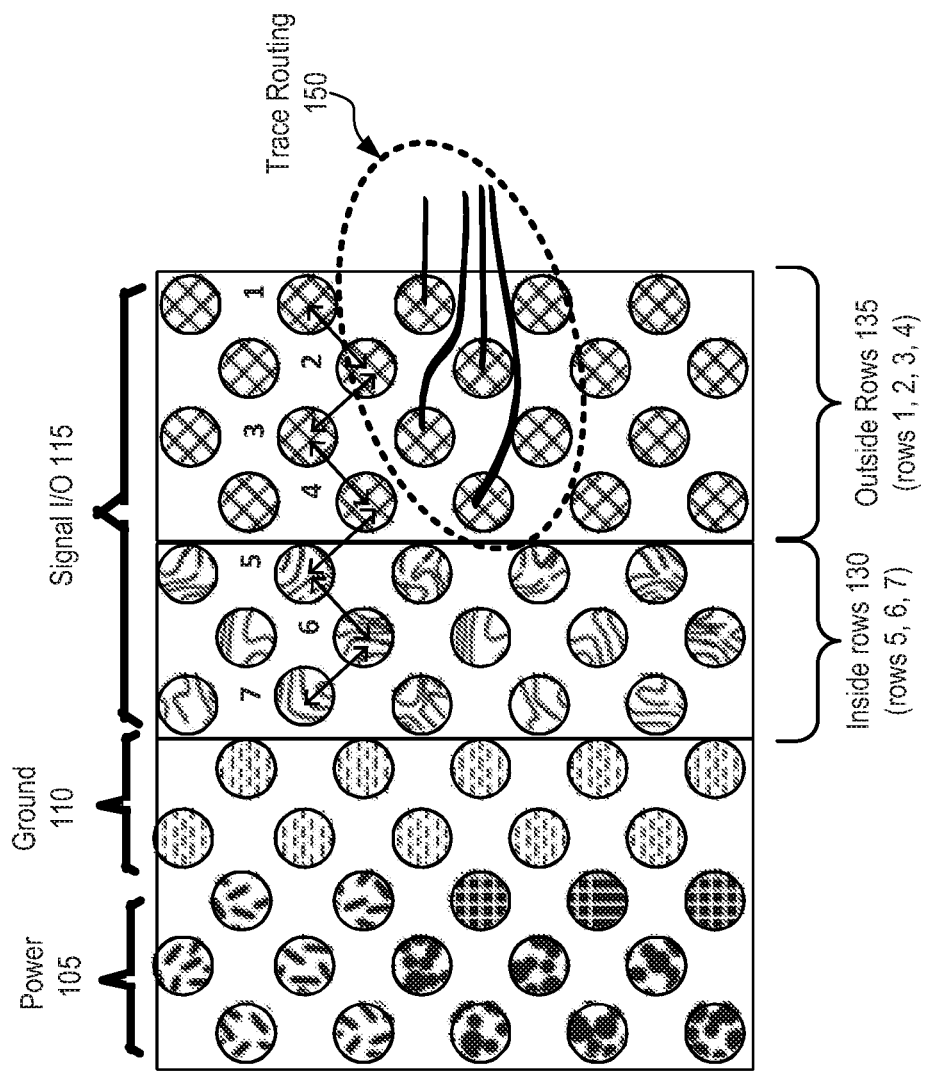
FIG. 1B depicts another exemplary bump system in accordance with described embodiments.

FIG. 1B depicts another exemplary bump system 101 in accordance with described embodiments.

As depicted, the trace routings 150 for any of the bumps of the outside rows 135 located in rows 1, 2, 3, and 4 of the bump system 100 is feasible in the space provided with sufficient margin between the electrical traces laid down by the trace routing 150 and the respective bumps of the bump system 100. Such trace routing 150 permits a surface escape for the bumps of the outside rows.

Conversely, surface escape trace routing 150 from the bumps at rows 5, 6, and 7 of the inside rows 130 simply is not feasible as the traces will overlap or make contact with the bumps in the outside rows, either of which is unacceptable as a non-design electrical short will result.

It is nevertheless required to break out the signals from all of the bumps of the bump system 100 and consequently, signals for rows one, two, three, and four are surface escaped via trace routing which effectively meanders around the bumps in front of them.

Problematically, the bumps of the inside rows 130 at rows five, six, and seven are blocked from a surface escape yet their signals require a breakout nonetheless.

It is therefore necessary to trace route the bumps of the inside rows 130 through a sub-surface layer rather than performing a top layer surface escape as is done for the outside rows 135. Accordingly, vias are formed through the top surface of the package substrate to permit the bumps to be sub-surface routed to provide signal breakout for the remainder of the signal I/O 115 bumps as well as the ground 110 and power 105 bumps.

So called "vias" are typically vertical electrical connections, hence the term "via" which pass completely through a silicon wafer or die, such as the top layer of a substrate having the bump system 100 affixed thereto. Use of such vias may be called upon as either an alternative to wire-bond and flip chip technologies or even supplement such technologies in the manufacturing of semiconductor devices including three-dimensional (3D) semiconductor packages, 3D integrated circuits, System on Chip (SoC) semiconductor devices, and related semiconductor components. Use of vias provides for a greater circuit density and additionally permits connections which are shorter in length.

Creation of the vias, however, represents additional processing, cost, complexity, which translates to the potential for manufacturability and reliability issues. although uses of vias is unlikely to be wholly eliminated in semiconductor package manufacturing, elimination of the requirement for at least a portion of the vias provides a potential for improvement, and elimination of sub-layers provides the potential for increased semiconductor package density.

Figure 1C:
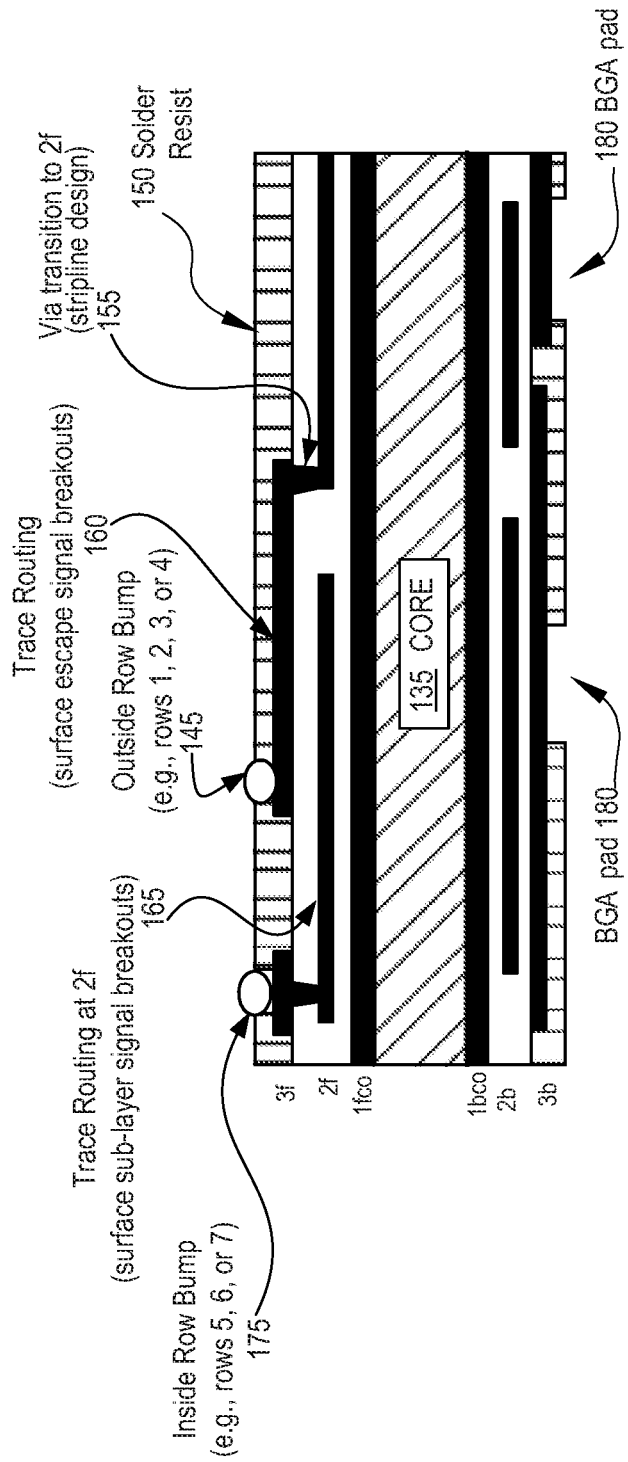
FIG. 1C depicts an exemplary six layer design for accommodating signal breakouts from such a bump system in accordance with described embodiments.

FIG. 1C depicts an exemplary six layer design 102 for accommodating signal breakouts from such a bump system 100 in accordance with described embodiments.

In particular, there is depicted a package substrate having embedded therein a CPU core 135 module positioned above layers 3b, 2b, 1bco and positioned beneath layers 1fco, 2f, and 3f.

Below the package substrate is depicted a ball grid array (BGA) pad 180 electrically interfaces the substrate of the package 400 to, for example, a mother board or other interfacing circuitry.

At a top portion of the diagram there is depicted both inside row bumps 175, for instance, those from rows 5, 6, or 7, and also outside row bumps 145, such as those at rows 1, 2, 3, and 4. Formed at the top layer is the solder resist 150 layer through which vias may be provided at fabrication.

The vias opened within the top surface layer 3f of the substrate package permit trace routing at 2f 165 to be accomplished for the inside row bumps 175 as is shown here with the via transition to 2f 155 of a stripeline design. Conversely, the outside row bumps 145 are depicted as having trace routing 160 permitting surface escape signal breakouts for the outside rows.

Therefore, to connect a ball of the BGA pad 180 to a signal breakout a via is opened (e.g., a hole through a substrate layer) through to the bottom side of the substrate package to permit the trace routing to breakout at the sub-layers where it is not feasible due to a limitation in the physical space at the surface layer.

Two layers at a minimum are therefore required for any of the inside row bumps 175 because the signal breakout cannot simply escape laterally on the surface as the trace will run into other bumps due to the bump system 100 being so dense. The signal trace breakouts for the inside rows must therefore be first routed down to a sub-layer through the vias, laterally along the sub-layer, and then back up to the surface layer at a point where the trace may surface outside of the bump field making up the bump system.

As depicted here, layers 3f and 2f breakout the depicted signals in the manner described with layer 3f providing surface escape and layer 2f providing sub-surface signal escape.

Because the substrate package is symmetrical, layers built on the top are also built on the bottom, and therefore, a six-layer substrate package results.

Each layer of such a substrate package may cost from a manufacturing and fabrication perspective approximately $0.20 which contributes to the cost of fabrication for the package merely to create the layers. While that per-unit cost is small, it add up to very large sums when combined with the many other complex fabrication operations and is then multiplied by a production run for the given substrate package which is easily into the hundreds of millions of units for any given package, thus resulting in an economic cost in the millions of dollars which translates into greater costs to eventual consumers.

Even the elimination of two layers from a semiconductor package therefore translates into significant cost savings which means the same computational power may be provided to end-user consumers at a lesser cost. Moreover, the elimination of layers reduces complexity and improves package density permitting greater performance in terms of computational power above and beyond the mere cost savings.

In order to achieve a four layer semiconductor package design to realize the improvements described it is necessary to accomplish the signal break outs by way of top surface escapes rather than through vias to sub-layer trace routing.

Figure 2:
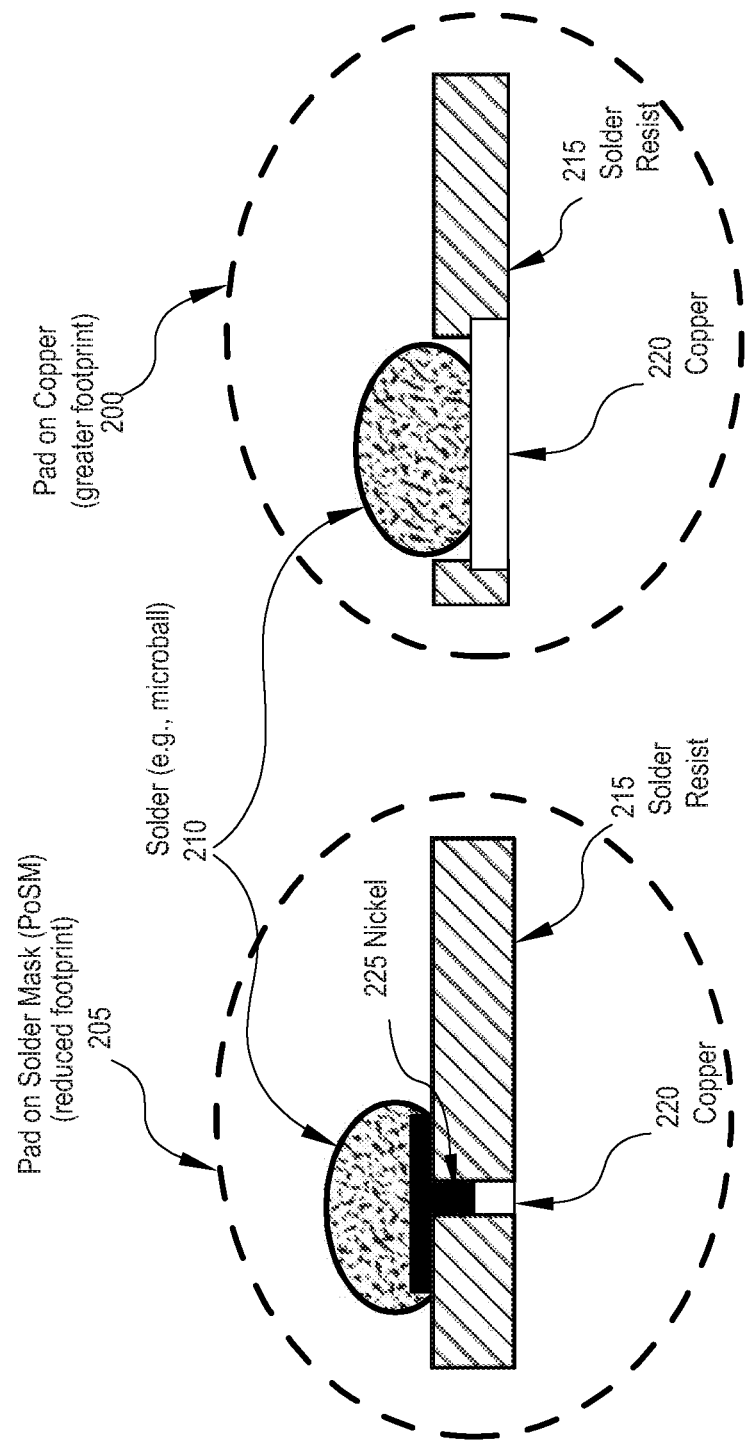
FIG. 2 depicts an exemplary Pad on Solder Mask (PoSM) design in comparison to a pad on copper design in accordance with described embodiments.

FIG. 2 depicts an exemplary Pad on Solder Mask (PoSM) 205 design in comparison to a pad on copper design 200 in accordance with described embodiments.

In particular, there is depicted on the left the Pad on Solder Mask 205 design resulting in the reduced footprint. The pad on copper design 200 results in greater or larger footprint thus occupying more physical space on the surface of the package substrate.

Making up the various components of the package substrate are the solder 210 on top, which is approximately uniform in size for both designs within the solder resist layer 215, however, it can be plainly seen that the space opened for the copper 220 of each respective design is significantly reduced in size. The solder 210 may also be referred to as solder balls or microballs or micro-solderballs.

On the left with the PoSM design 205, the solder ball sits atop a nickel 225 fill which makes metallic and thus electrical connectivity between the bottom most portion of the solder resist 215 layer through to the copper 220 core up into the nickel 225 inset and into the solder 210. Functionality on the right side pad on copper 200 design is identical in terms of providing consistent metal to metal and thus electrical connectivity from the solder 210 ball to the copper 220 at the bottom-most portion of the solder resist 215 of the pad-on-copper design. The size requirement of the pad on copper design is significantly greater, however, and thus inhibits surface signal breakouts.

Dimensionally, the physical size of the pad on copper 200 design is in the 100 to 200 microns in diameters range. According to certain embodiments, the resulting physical size of the PoSM design 205 design is in the sub-10 microns in diameters range, or less than 10% of the size occupied at the bottom of the solder resist layer by the copper in the pad-on-copper 200 shown.

Consider therefore every single bump of the earlier depicted bump system 100 occupying either the reduced foot print of the PoSM 205 design versus the greater footprint of the pad on copper 200 design and the physical space requirements over the aggregate of the entire bump system 100 is significantly reduced by the PoSM 205 design.

FIG. 3 depicts another exemplary Pad on Solder Mask (PoSM) 305 design in comparison to a pad on copper design 300 in accordance with described embodiments.

In particular, depicted on top is the Pad on Solder Mask (PoSM) 305 design depicting the PoSM on the front row of the pad at element 315. Solder bumps post flattening 325 are depicted (e.g., microballs, solderballs, micro-solder balls) being electrically and metallically interfaced to the nickel layer 330 which sits atop the solder resist 335 layer and is then depicted atop an ABF (Ajinomoto Build-up Film) 310 layer, however, other substrate layers may be utilized, such as an NCA (non-conductive adhesive) filler or substrate layer, an NCF (non-conductive film) filler or substrate layer, an ACF (anisotropic conductive film) filler or substrate layer, or any other such filler or substrate layer known to the industry.

The nickel layer 330 may be formed from nickel pads, nickel contacts, nickel fill, or nickel plugs according to design requirements. Regardless of how formed, the nickel layer 330 depicted here positioned upon the solder resist layer and partially within the solder resist layer beneath the solder bumps as part of the PoSM design 305 is positioned upon a substrate surface and beneath the solder resist 335 layer for the pad on copper 300 design.

More interestingly, it may be observed that the physical space requirements of the copper pad 320 are substantially reduced in comparison with the larger copper pads 320 depicted to the right of the non-PoSM design pads which are provided by way of example for the sake of size comparison. It is not necessary to have the larger non-PoSM design copper pads within the same substrate package, although they certainly could be if appropriate for the design requirements.

The pad on copper design 300 is shown in greater detail on the bottom, with the pad on copper on the front row of the pad 316 depicted for the entire substrate package in which the solder bumps post flattening 325 are depicted being electrically and metallically interfaced to the copper pad 320 without interfacing through any nickel layer as with the PoSM design. The copper pads 320 sit atop the ABF 310 layer or other selected filler or substrate layer as appropriate.

With the pad on solder mask design it is therefore possible to electrically interface to the signal breakouts at the surface of the substrate package permitting trace routing without having to route down through vias to a sub-layer, laterally through the sub-layer, and then back up to the surface layer. Because the sub-layer is no longer required for the trace routing it is therefore feasible to eliminate the sub-layer (shown at element 2f of FIG. 1C) and because the package is symmetrical, it is likewise feasible to eliminate the corresponding sub-layer (shown at element 2b of FIG. 1C), thus eliminating two layers from the depicted six layer design 102 of FIG. 1C.

By electrically interfacing to the signal breakouts at the surface of the package substrate the physical size requirements are reduced or each signal breakout point connecting with a trace route from an approximate 100-200 microns down to significantly reduced sub-micron foot print, thus permitting a greater number of trace route signal breakouts to traverse the multiple rows obstructing them from an edge. Stated differently, where prior pad on copper design signal breakout contact points permitted only two exemplary signal breakouts to be traced between each bump of a row, the Pad on Solder Mask (PoSM) design permits an exemplary four signal breakout trace routes, or double the number, through the obstructing rows, which translates to a greater number of rows deep into the bump system having a surface escape path to an edge, translating into cost reductions, elimination of two sub-layers, and greater substrate package density.

Direct observation of the resulting bottom surface of a package substrate where the signal traces electrically contact with the PoSM 305 design pads will reveal simply a very small dot in appearance versus a much larger circular contact pad for the pad on copper 300 design contact points.

Functionality and contact mechanisms on a top surface of the same substrate package are wholly unaffected as the solder bumps post flattening 325 as observed for both the PoSM design 305 and also the pad on copper design 300 remain consistent at an upper most surface in terms of their size upon the substrate package and their ability to interface to a functional silicon die to which they will ultimately be electrically interfaced.

The resulting contact points which electrically interface with the signal breakouts or electrical traces may therefore be considered micro pads as they are significantly smaller in size than the pad on copper design pads at the trace contact point, resulting in a distinct visual appearance as merely a very small dot and more critically, functionally providing metal to metal electrical connectivity through the solder resist 335 up to the solder bumps such that the semiconductor device itself functions in an electrical sense identically with a PoSM design or a pad on copper design or a combination of both designs.

According to a particular embodiment, surface finishing is applied to overcome oxidizing of the copper pads 320 depicted. In particular, the surface finishing is accomplished through the application of the depicted nickel layer 330. According to another embodiment, a nickel layer 330 and a thin layer of gold is applied to eliminate the oxidation of the copper pads 320. According to a particular embodiment processing includes Electroless Nickel Immersion Gold (ENIG) to lay down the nickel layer 330 and the gold layer. Electroless nickel immersion gold is a type of surface plating used for printed circuit boards which consists of an electroless nickel plating covered with a thin layer of immersion gold, which protects the nickel from oxidation and in turn protects the copper from oxidation as well.

As depicted, the PoSM design 305 results in a copper pillar with a nickel pillar below and where ENIG processing is applied, an additional layer of gold to prevent copper oxidation.

The depicted PoSM design 305 therefore results in a different shape versus the pad on copper design 300 but within the same thickness and with the same electrical functionality.

It is the very small pillar section with a foot print in the sub-10 micron diameter which is then exposed to the surface for signal breakout and trace routing.

According to a particular embodiment, formation of the surface breakouts from the contact pads establishes the First Level Interconnect (FLI) layer of a substrate package for a functional semiconductor device. The FLI layer may form the substrate layer of a substrate package.

According to another embodiment, the substrate is part of the FLI and the solder resist is laminated, for instance, via dry film (DF) lamination process to provide a photoresist layer in support of the image transfer process within which the T-shaped nickel, copper, and gold pillar may be formed. For instance, through photolithography, the space may be opened within the photo resist layer within which the copper, nickel, and gold is then placed forming the T-shaped pillar depicted. Once formed, the micro-ball to form the solder bump is then applied.

Figure 4A:
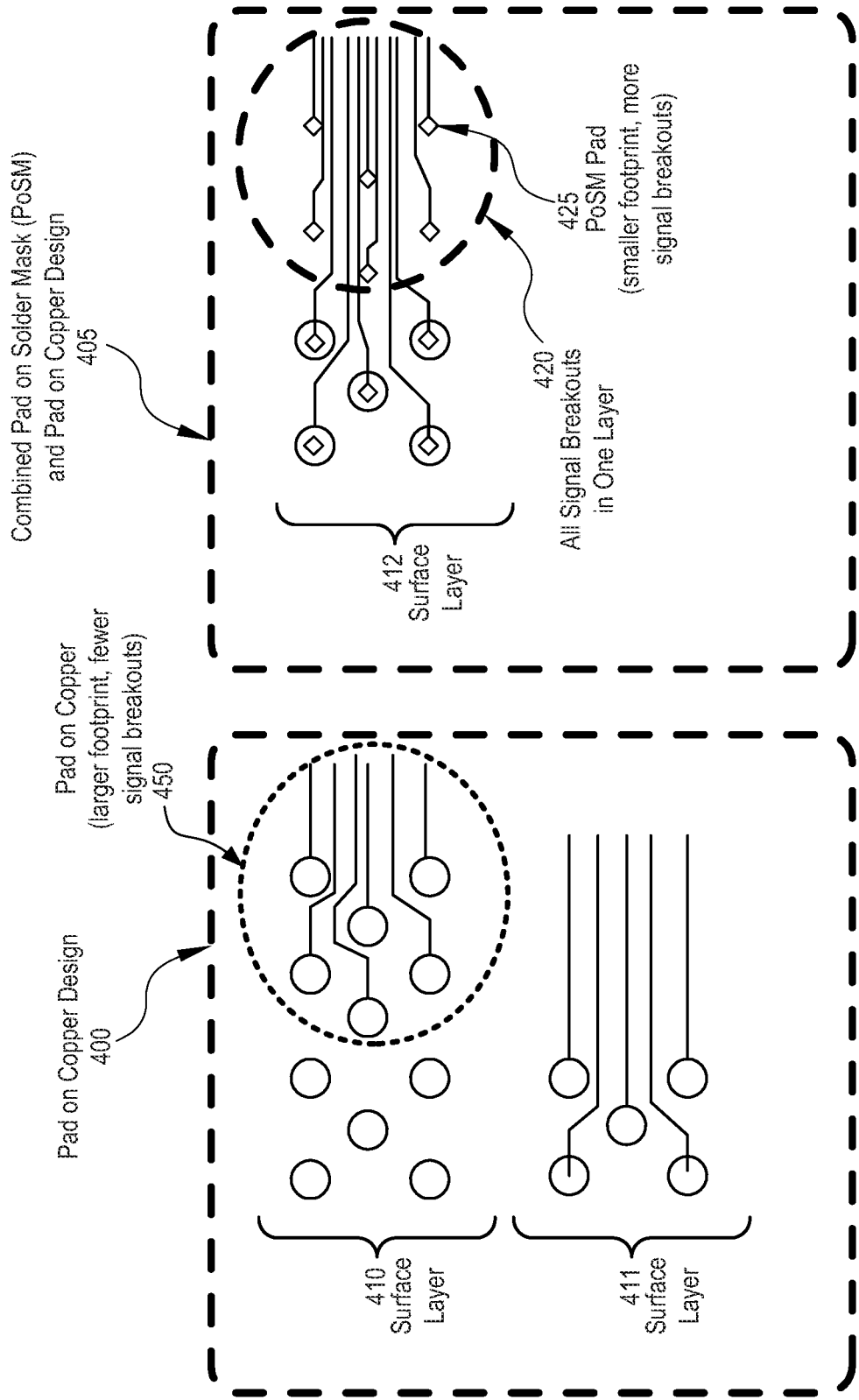
FIG. 4A depicts exemplary signal breakouts at the surface layer of a pad on copper design and a combined Pad on Solder Mask (PoSM) design and pad on copper design in accordance with described embodiments.

FIG. 4A depicts exemplary signal breakouts at the surface layer of a pad on copper design 400 and a combined Pad on Solder Mask (PoSM) design and pad on copper design 405 in accordance with described embodiments.

In particular, depicted on the left is the pad on copper design 400 at surface 400 having the pad on copper pad 450 with the larger footprint and its various signal breakouts at the top surface layer 410 as shown. Notably, there are multiple rows of bumps behind the bumps having trace route escapes at the top surface layer 400 but for which there is not sufficient room remaining between the various bumps of the bump system. At the surface layer 411 depicted below it is further shown that the pad on copper bumps are trace routed from the inside rows which in the surface layer 410 above would be obstructed by the outside rows, however, at surface layer 411, it can be seen that there now remains insufficient space for the pad on copper contacts due to the trace routes interconnecting the pads shown.

Conversely, depicted on the right hand side is a combined Pad on Solder Mask (PoSM) and pad on copper design 405 which, as depicted, has a combination of the larger and smaller contact positions at the surface layer 412. Depicted here, all of the signal breakouts are accomplished in a single surface layer as indicated by element 420. Notably, the PoSM pads 425 at the right side of the combined pad depiction result in a very small (e.g., sub-10 micron diameter) footprint through which there are many signal breakouts, including the signal breakouts from the inside rows which as depicted here are the larger contact pads.

FIG. 4B depicts another Pad on Solder Mask (PoSM) pad design 405 for the signal breakouts at a surface layer 413. As depicted here, all of the pads are PoSM pad design 405 providing all of the signal breakouts in one single layer 445 as shown. With the smaller footprint pads resulting from the PoSM pad design there is sufficient physical space through which to trace route the signal escapes including from the inside rows as shown in accordance with described embodiments.

Figure 5:
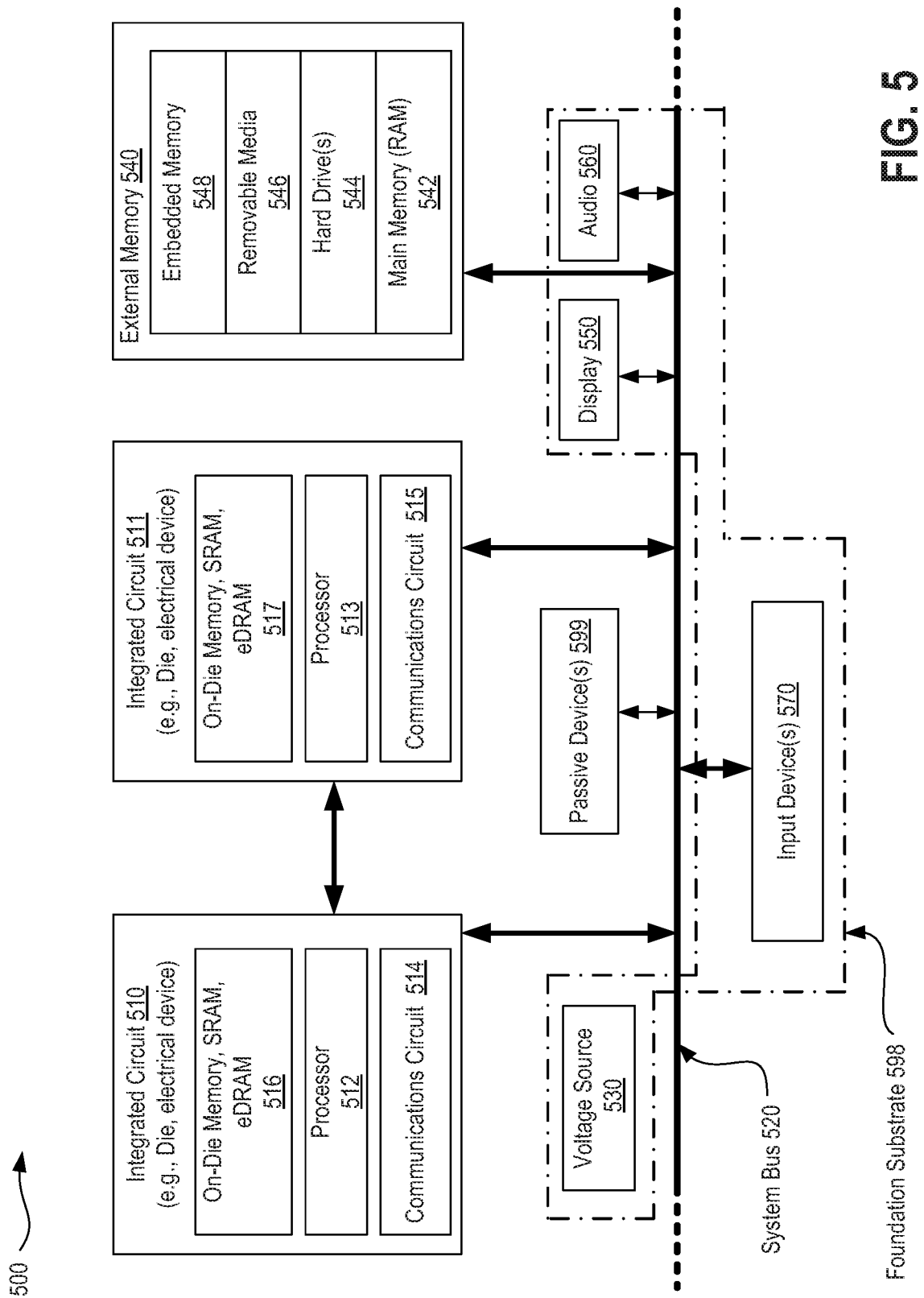
FIG. 5 is a schematic of a computer system in accordance with described embodiments.

FIG. 5 is a schematic of a computer system 500 in accordance with described embodiments. The computer system 500 (also referred to as the electronic system 500) as depicted can embody high speed serial controller testing means as well as means for implementing a Pad on Solder Mask (PoSM) semiconductor substrate package, according to any of the several disclosed embodiments and their equivalents as set forth in this disclosure. The computer system 500 may be a mobile device such as a net-book computer. The computer system 500 may be a mobile device such as a wireless smart phone or tablet. The computer system 500 may be a desktop computer. The computer system 500 may be a hand-held reader. The computer system 500 may be a server system. The computer system 500 may be a supercomputer or high-performance computing system.

In accordance with one embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

Such an integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, electrical devices having gradient encapsulant protection, as disclosed herein.

In accordance with one embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In accordance with one embodiment, the integrated circuit 510 is complemented with a subsequent integrated circuit 511. Useful embodiments include a dual processor 513 and a dual communications circuit 515 and dual on-die memory 517 such as SRAM. In accordance with one embodiment, the dual integrated circuit 510 includes embedded on-die memory 517 such as eDRAM.

In one embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In accordance with one embodiment, the electronic system 500 also includes a display device 550 and an audio output 560. In one embodiment, the electronic system 500 includes an input device 570 such as a controller that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate or a semiconductor package having therein high speed serial controller testing means as well as means for implementing a Pad on Solder Mask (PoSM) semiconductor substrate package, according to any of the several disclosed embodiments and their equivalents, an electronic system, a computer system, one or more methods of fabricating an integrated circuit, and one or more methods of fabricating an electronic assembly that includes a package substrate or a semiconductor package having therein high speed serial controller testing means as well as means for implementing a Pad on Solder Mask (PoSM) semiconductor substrate package, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having high speed serial controller testing means as well as means for implementing a Pad on Solder Mask (PoSM) semiconductor substrate package embodiments and their equivalents. A foundation substrate 598 may be included, as represented by the dashed line of FIG. 5. Passive devices 599 may also be included, as is also depicted in FIG. 5.

Figure 6:
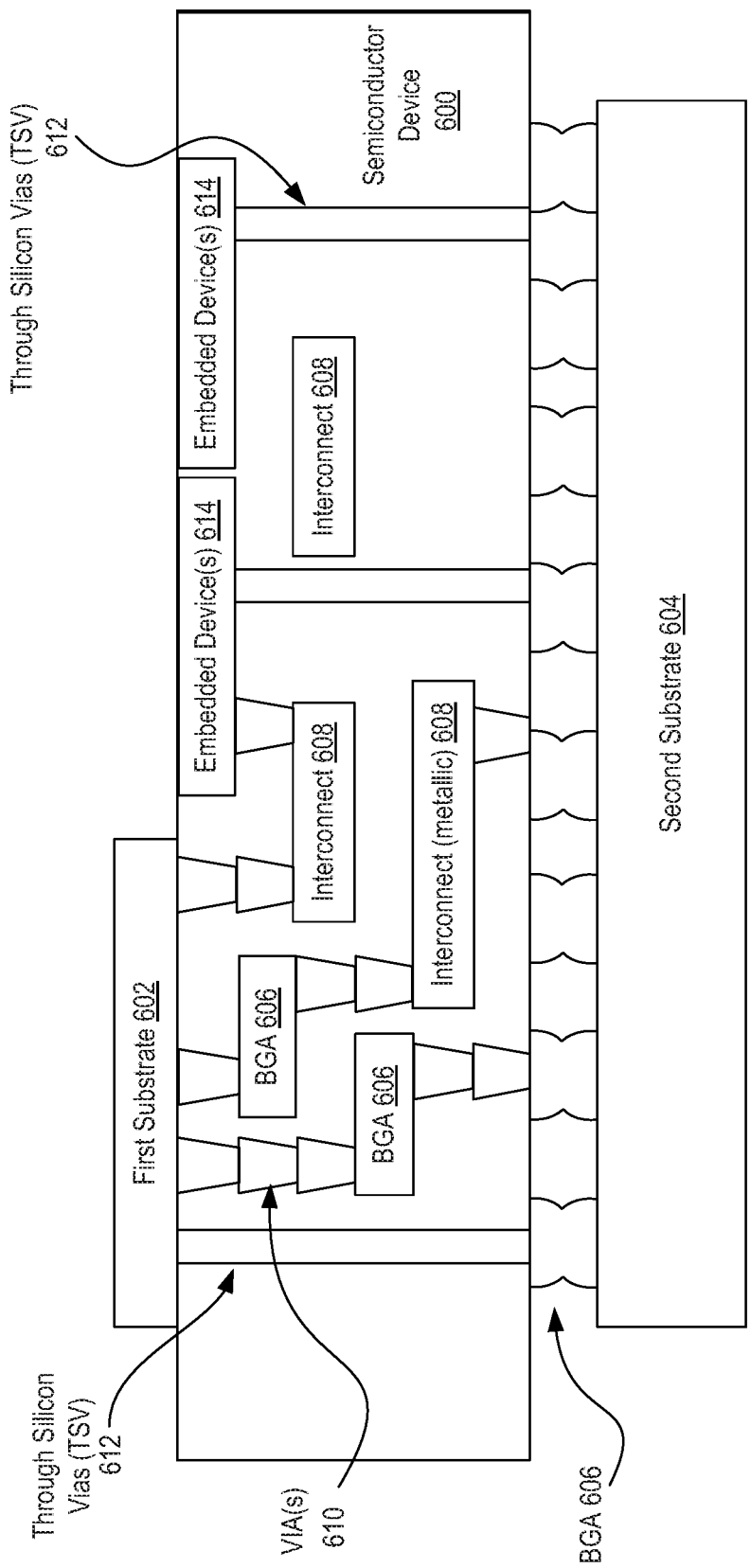
FIG. 6 illustrates an interposer that includes one or more described embodiments.

FIG. 6 illustrates an interposer 600 that includes one or more described embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with described embodiments, apparatuses or processes disclosed herein may be used in the fabrication of interposer 600.

Figure 7:
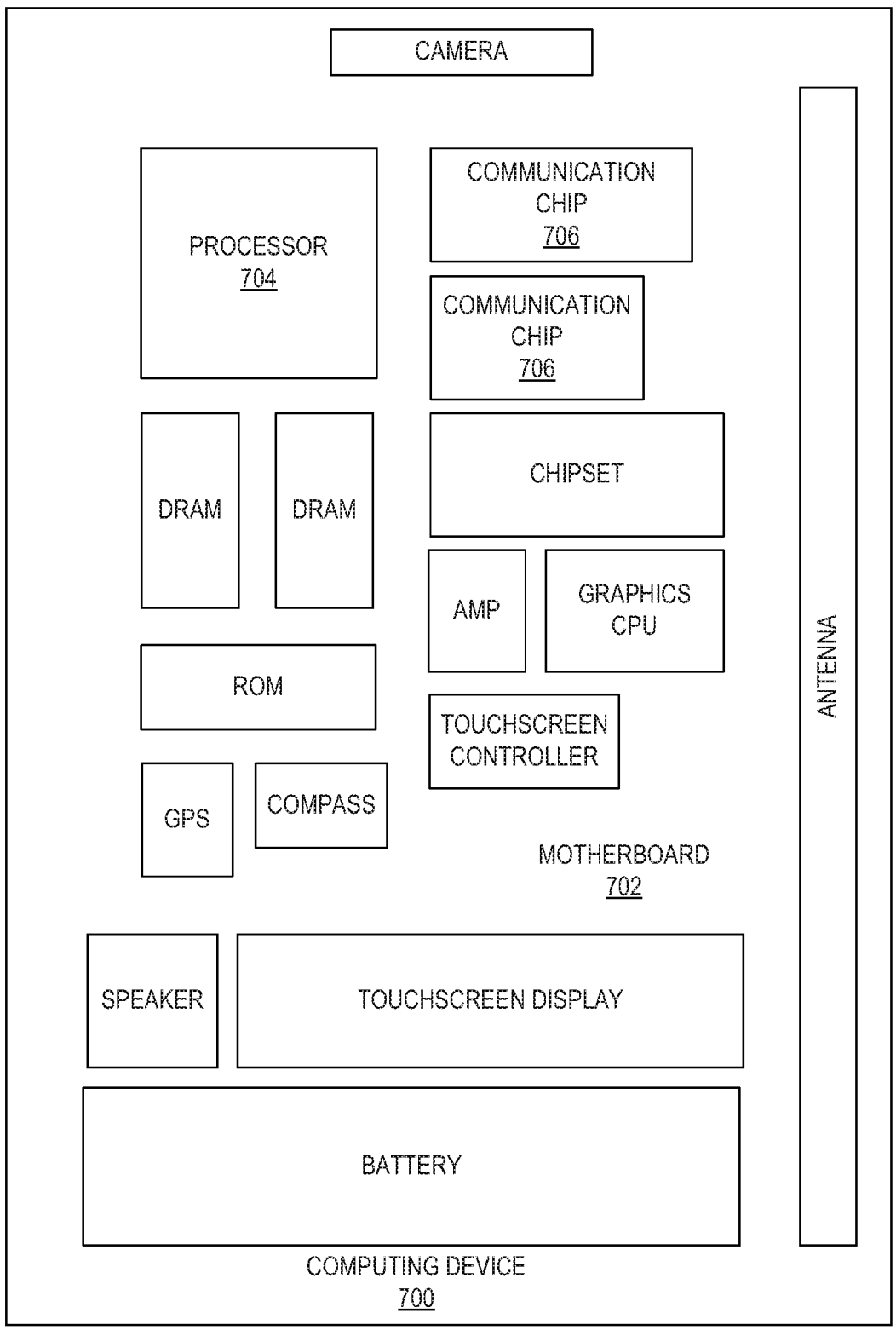
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

FIG. 8 is a flow diagram illustrating a method 800 for implementing a Pad on Solder Mask (PoSM) semiconductor substrate package in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 800 may be utilized in a variety of combinations.

At block 805 the method 800 for implementing a Pad on Solder Mask (PoSM) semiconductor substrate package begins with fabricating a substrate at a bottom layer of the substrate package.

At block 810 the method includes fabricating a solder resist layer above the substrate at the bottom layer.

At block 815 the method includes opening vias within the solder resist layer.

At block 820 the method includes depositing conductive pads exposed at a bottom surface of the solder resist layer.

At block 825 the method includes depositing nickel pads atop the conductive pads exposed at a bottom surface of the solder resist layer, the nickel pads at least partially within the solder resist layer.

At block 830 the method includes depositing a plurality of solder balls at a top surface of the solder resist layer.

At block 835 the method includes electrically interfacing a functional silicon die positioned above the solder resist layer to the solder resist layer using a plurality of die bumps at a bottom surface of the functional silicon die, the plurality of die bumps electrically interfacing the functional silicon die to the substrate through the plurality of solder balls at the top surface of the solder resist layer and through the nickel pads and into the conductive pads exposed at the bottom surface of the solder resist layer.

At block 840 the method includes electrically interfacing each of the conductive pads exposed at the bottom surface of the solder resist layer to an electrical trace at the substrate of the substrate package.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is an apparatus to implement a substrate package, the substrate package having therein a functional silicon die at a top layer of the substrate package; a solder resist layer beneath the functional silicon die of the substrate package; a plurality of die bumps at a bottom surface of the functional silicon die, the plurality of die bumps electrically interfacing the functional silicon die to a substrate through a plurality of solder balls at a top surface of the solder resist layer; each of the plurality of die bumps electrically interfaced to a nickel pad at least partially within the solder resist layer and beneath the solder balls; each of the plurality of die bumps electrically interfaced through the nickel pads to a conductive pad exposed at a bottom surface of the solder resist layer; and in which each of the conductive pads exposed at the bottom surface of the solder resist layer are electrically interfaced to an electrical trace at the substrate of the substrate package.

According to another embodiment, at least a portion of the conductive pads exposed at the bottom surface of the solder resist layer are less than 10 microns in diameter where exposed at the bottom surface of the solder resist layer.

According to another embodiment, at the electrical traces provide for signal breakout at the substrate of the substrate package for the die bumps positioned at the bottom surface of the functional silicon die through the solder resist layer.

According to another embodiment, the substrate of the substrate package forms a dielectric layer having the electrical traces embedded therein, the electrical traces to electrically interface the functional silicon die at the top layer of the substrate package to the substrate at a bottom layer of the semiconductor substrate package.

According to another embodiment, the electrical traces are formed upon a top surface of the substrate of the substrate package or within an interconnect layer at the substrate of the substrate package.

According to another embodiment, the substrate forms a bottom layer of the substrate package; and in which the substrate is formed from one of: an Ajinomoto Build-up Film (ABF) substrate layer; a Non-Conductive Film (NCF) substrate layer; or an Anisotropic Conductive Film (ACF) substrate layer.

According to another embodiment, the conductive pads exposed at a bottom surface of the solder resist layer each include an electrically conductive copper pad; in which each of the electrically conductive copper pads have a continuous metallic to metallic interface from the electrically conductive copper pad up through the solder resist layer of the package substrate into the nickel pad and continuing into the solder balls at the top surface of the solder resist layer and into a respective one of the plurality of die bumps at the bottom surface of the functional silicon die.

According to another embodiment, each of the electrically conductive copper pads further include a layer of a gold film to prevent oxidation of the electrically conductive copper pads.

According to another embodiment, the gold film is formed by Electroless Nickel Immersion Gold (ENIG) processing.

According to another embodiment, each of the solder balls include one of: solder bumps, solder deposits, flattened solder balls, or micro solder balls.

According to another embodiment, T-shape structures are formed by the solder balls being metallically interfaced to the nickel pads at least partially within the solder resist layer and metallically interfaced to the conductive pads exposed at the bottom of the solder resist layer; and in which the T-shape structures provide a continuous electrically conductive path from through the solder resist layer.

According to another embodiment, metallic and electrically conductive pillars are formed at least partially within the solder resist layer from a buildup process of (i) the conductive pads exposed at the bottom of the solder resist layer; (ii) the nickel pads at least partially within the solder resist layer; and (iii) the solder balls positioned atop the nickel pads.

According to another embodiment, the substrate package is embodied within one of: a Pad on Solder Mask (PoSM) design semiconductor substrate package; a three-dimensional (3D) semiconductor package a Central Processing Unit (CPU) substrate package; a Platform Controller Hub (PCH) substrate package; and a System On a Chip (SOC) substrate package.

According to another embodiment, the conductive pads exposed at the bottom surface of the solder resist layer form a bump system having electrical interfaces to the electrical traces for trace routing the electrical traces away from the bump system; in which the bump system provides signal escape and trace routing upon exactly one surface of the substrate for all of the plurality of die bumps at the bottom surface of the functional silicon die through the solder resist layer.

According to another embodiment, a first portion of the conductive pads exposed at the bottom surface of the solder resist layer are less than 10 microns in diameter where exposed at the bottom surface of the solder resist layer; and in which a second portion of the conductive pads exposed at the bottom surface of the solder resist layer are greater than 100 microns in diameter where exposed at the bottom surface of the solder resist layer.

According to another embodiment, the conductive pads exposed at the bottom surface of the solder resist layer form a bump system arranged into a plurality of rows; in which the first portion of the conductive pads being less than 10 microns in diameter are positioned at one or more outer most rows of the of the bump system; and in which the second portion of the conductive pads being greater than 100 microns in diameter are positioned at one or more inner most rows of the of the bump system.

According to another embodiment, the conductive pads exposed at the bottom surface of the solder resist layer form a bump system arranged into a plurality of rows; in which the first portion of the conductive pads being less than 10 microns in diameter are positioned at an outer most first, second, third, and fourth row of the bump system; and in which the second portion of the conductive pads being greater than 100 microns in diameter are positioned at inside rows positioned fifth, sixth, and seventh rows from the first row of the bump system.

According to another embodiment, the substrate package embodies a four layer (4 L) substrate package design.

It is in accordance with yet another embodiment that there is a method for implementing a Pad on Solder Mask (PoSM) design substrate package, in which the method includes: fabricating a substrate at a bottom layer of the substrate package; fabricating a solder resist layer above the substrate at the bottom layer; opening vias within the solder resist layer; depositing conductive pads exposed at a bottom surface of the solder resist layer; depositing nickel pads atop the conductive pads exposed at a bottom surface of the solder resist layer, the nickel pads at least partially within the solder resist layer; depositing a plurality of solder balls at a top surface of the solder resist layer; electrically interfacing a functional silicon die positioned above the solder resist layer to the solder resist layer using a plurality of die bumps at a bottom surface of the functional silicon die, the plurality of die bumps electrically interfacing the functional silicon die to the substrate through the plurality of solder balls at the top surface of the solder resist layer and through the nickel pads and into the conductive pads exposed at the bottom surface of the solder resist layer; and electrically interfacing each of the conductive pads exposed at the bottom surface of the solder resist layer to an electrical trace at the substrate of the substrate package.

According to another embodiment, the conductive pads exposed at the bottom surface of the solder resist layer each include an electrically conductive copper pad; in which the method further includes: depositing a layer of a gold film to the to prevent oxidation of the electrically conductive copper pads by applying Electroless Nickel Immersion Gold (ENIG) processing to the substrate package.

According to another embodiment, a first portion of the conductive pads exposed at the bottom surface of the solder resist layer are less than 10 microns in diameter where exposed at the bottom surface of the solder resist layer; and in which a second portion of the conductive pads exposed at the bottom surface of the solder resist layer are greater than 100 microns in diameter where exposed at the bottom surface of the solder resist layer.

According to another embodiment, the conductive pads exposed at the bottom surface of the solder resist layer form a bump system arranged into a plurality of rows; in which the first portion of the conductive pads being less than 10 microns in diameter are positioned at one or more outer most rows of the of the bump system; and in which the second portion of the conductive pads being greater than 100 microns in diameter are positioned at one or more inner most rows of the of the bump system.

According to yet another embodiment there is a system to implement a Pad on Solder Mask (PoSM) design substrate package, the system including: a processor and a memory to execute instructions; a printed circuit board (PCB) motherboard having the memory mounted thereupon; and a substrate package mounted to the PCB motherboard, the semiconductor package including: (i) a functional silicon die at a top layer of the substrate package; (ii) a solder resist layer beneath the functional silicon die of the substrate package; (iii) a plurality of die bumps at a bottom surface of the functional silicon die, the plurality of die bumps electrically interfacing the functional silicon die to a substrate through a plurality of solder balls at a top surface of the solder resist layer; (iv) each of the plurality of die bumps electrically interfaced to a nickel pad at least partially within the solder resist layer and beneath the solder balls; (v) each of the plurality of die bumps electrically interfaced through the nickel pads to a conductive pad exposed at a bottom surface of the solder resist layer; and (vi) in which each of the conductive pads exposed at the bottom surface of the solder resist layer are electrically interfaced to an electrical trace at the substrate of the substrate package.

According to another embodiment, the substrate package mounted to the PCB motherboard is embodied within one of: a Pad on Solder Mask (PoSM) design semiconductor substrate package; a three-dimensional (3D) semiconductor package a Central Processing Unit (CPU) substrate package; a Platform Controller Hub (PCH) substrate package; and a System On a Chip (SOC) substrate package.

According to another embodiment, the system is embodied within one of: a smart phone; a tablet; a hand-held computing device; a personal computer; or a wearable technology to be worn as a clothing item or an accessory.

What is claimed is:

1. A substrate package, comprising:
 a functional silicon die at a top layer of the substrate package;
 a solder resist layer beneath the functional silicon die of the substrate package;
 a plurality of die bumps at a bottom surface of the functional silicon die, the plurality of die bumps electrically interfacing the functional silicon die to a substrate through a plurality of solder balls;
 a plurality of copper pads within the solder resist layer, wherein a first one of the plurality of solder balls directly contacts a first one of the plurality of copper pads, and wherein a portion of the first one of the plurality of solder balls is within the solder resist layer; and
 a nickel layer on a second one of the plurality of copper pads, the nickel layer within the solder resist layer and extending laterally over an uppermost surface of the solder resist layer, wherein a second one of the plurality of solder balls directly contacts the nickel layer;
 wherein each of the plurality of copper pads are electrically interfaced to a respective one of a plurality of electrical traces at the substrate of the substrate package.

2. The substrate package of claim 1, wherein at least a portion of the plurality of copper are less than 10 microns in diameter.

3. The substrate package of claim 1:
 wherein the electrical traces provide for signal breakout for the die bumps positioned at a bottom surface of the functional silicon die through the solder resist layer at the substrate of the substrate package.

4. The substrate package of claim 1, wherein the substrate of the substrate package comprises a dielectric layer having the electrical traces embedded therein, and the electrical traces electrically interface the functional silicon die at the top layer of the substrate package to the substrate at a bottom layer of the semiconductor substrate package.

5. The substrate package of claim 1, wherein the electrical traces are formed upon a top surface of the substrate of the substrate package or within an interconnect layer at the substrate of the substrate package.

6. The substrate package of claim 1:
 wherein the substrate forms a bottom layer of the substrate package; and wherein the substrate is formed from one of:
 an Ajinomoto Build-up Film (ABF) substrate layer;
 a Non-Conductive Film (NCF) substrate layer; or
 an Anisotropic Conductive Film (ACF) substrate layer.

7. The substrate package of claim 1, further comprising:
 a layer of a gold film between the nickel layer and the second one of the plurality of solder balls.

8. The substrate package of claim 7, wherein the gold film is formed by Electroless Nickel Immersion Gold (ENIG) processing.

9. The substrate package of claim 1, wherein each of the solder balls comprise one of:
 solder bumps, solder deposits, flattened solder balls, or micro solder balls.

10. The substrate package of claim 1, wherein the substrate package is embodied within one of:
 a Pad on Solder Mask (PoSM) design semiconductor substrate package;
 a three-dimensional (3D) semiconductor package a Central Processing Unit (CPU) substrate package;
 a Platform Controller Hub (PCH) substrate package; and
 a System On a Chip (SOC) substrate package.

11. The substrate package of claim 1:
 wherein the second one of the plurality of copper pads is less than 10 microns in diameter; and
 wherein the first one of the plurality of copper pads is greater than 100 microns in diameter.

12. The substrate package of claim 1, wherein the substrate package embodies a four layer (4 L) substrate package design.

13. A system to implement a Pad on Solder Mask (PoSM) design substrate package, the system comprising:
 a processor and a memory to execute instructions;
 a printed circuit board (PCB) motherboard having the memory mounted thereupon; and a substrate package mounted to the PCB motherboard, the semiconductor package comprising:
 (i) a functional silicon die at a top layer of the substrate package;
 (ii) a solder resist layer beneath the functional silicon die of the substrate package;
 (iii) a plurality of die bumps at a bottom surface of the functional silicon die, the plurality of die bumps electrically interfacing the functional silicon die to a substrate through a plurality of solder balls;
 (iv) a plurality of copper pads within the solder resist layer, wherein a first one of the plurality of solder balls directly contacts a first one of the plurality of copper pads, and wherein a portion of the first one of the plurality of solder balls is within the solder resist layer; and
 (v) a nickel layer on a second one of the plurality of copper pads, the nickel layer within the solder resist layer and extending laterally over an uppermost surface of the solder resist layer, wherein a second one of the plurality of solder balls directly contacts the nickel layer;
 (vi) wherein each of the plurality of copper are electrically interfaced to a respective one of a plurality of electrical traces at the substrate of the substrate package.

14. The system of claim 13, wherein the substrate package mounted to the PCB motherboard is embodied within one of:

a Pad on Solder Mask (PoSM) design semiconductor substrate package;

a three-dimensional (3D) semiconductor package a Central Processing Unit (CPU) substrate package;

a Platform Controller Hub (PCH) substrate package; and a System On a Chip (SOC) substrate package.

15. The system of claim 13, wherein the system is embodied within one of:

a smart phone;

a tablet;

a hand-held computing device;

a personal computer; or a wearable technology to be worn as a clothing item or an accessory.

16. A substrate package, comprising:

a functional silicon die at a top layer of the substrate package;

a solder resist layer beneath the functional silicon die of the substrate package;

a plurality of die bumps at a bottom surface of the functional silicon die, the plurality of die bumps electrically interfacing the functional silicon die to a substrate through a plurality of solder balls at a top surface of the solder resist layer;

each of the plurality of die bumps electrically interfaced to a nickel pad at least partially within the solder resist layer and beneath the solder balls;

each of the plurality of die bumps electrically interfaced through the nickel pads to a respective one of a plurality of conductive pads exposed at a bottom surface of the solder resist layer; and wherein each of the conductive pads exposed at the bottom surface of the solder resist layer are electrically interfaced to a respective one of a plurality of electrical traces at the substrate of the substrate package;

wherein a first portion of the conductive pads exposed at the bottom surface of the solder resist layer are less than 10 microns in diameter where exposed at the bottom surface of the solder resist layer;

wherein a second portion of the conductive pads exposed at the bottom surface of the solder resist layer are greater than 100 microns in diameter where exposed at the bottom surface of the solder resist layer;

wherein the conductive pads exposed at the bottom surface of the solder resist layer form a bump system arranged into a plurality of rows;

wherein the first portion of the conductive pads being less than 10 microns in diameter are positioned at an outer most first, second, third, and fourth row of the bump system; and wherein the second portion of the conductive pads being greater than 100 microns in diameter are positioned at inside rows positioned fifth, sixth, and seventh rows from the first row of the bump system.

\* \* \* \* \*